(12) United States Patent
Cheng (10) Patent No.: US 10,516,042 B2
(45) Date of Patent: Dec. 24, 2019

(54) III GROUP NITRIDE SEMICONDUCTOR DEVICE AND MANUFACTURING METHOD THEREOF

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 0 days.

(21) Appl. No.: 15/099,649

(22) Filed: Apr. 15, 2016

(65) Prior Publication Data

US 2016/0233328 A1  Aug. 11, 2016

Related U.S. Application Data

(63) Continuation of application No. PCT/CN2014/088538, filed on Oct. 14, 2014.

(30) Foreign Application Priority Data

Oct. 15, 2013  (CN) .......................... 2013 1 0482857

(51) Int. Cl.
*H01L 29/778* (2006.01)
*H01L 29/423* (2006.01)
(Continued)

(52) U.S. Cl.
CPC ...... *H01L 29/7787* (2013.01); *H01L 21/0228* (2013.01); *H01L 21/0254* (2013.01);
(Continued)

(58) Field of Classification Search
CPC ............. H01L 29/7786; H01L 29/7787; H01L 29/517; H01L 29/4236; H01L 29/518; H01L 21/02326; H01L 21/02178
See application file for complete search history.

(56) References Cited

U.S. PATENT DOCUMENTS 8,941,118 B1 *  1/2015  Chu ..................... H01L 29/2003
                                                              257/192
2005/0017319 A1 *  1/2005  Manabe ............ H01L 21/28185
                                                              257/498
(Continued)

FOREIGN PATENT DOCUMENTS

CN         103117303 A    5/2013
CN      201310049854 A    5/2013
(Continued)

OTHER PUBLICATIONS

PCT International Search Report for PCT/CN2014/088538 (priority application), dated Dec. 31, 2014.
(Continued)

*Primary Examiner* — Michele Fan
(74) *Attorney, Agent, or Firm* — Flener IP & Business Law; Zareefa B. Flener (57) ABSTRACT

An III group nitride semiconductor device comprises: a substrate; a nitride semiconductor layer located on the substrate; a passivation layer located on the nitride semiconductor layer, a portion of the passivation layer in a gate region being etched to expose the nitride semiconductor layer so as to form a gate groove; a composite dielectric layer located on the passivation layer and the gate groove, the composite dielectric layer comprising one or more combination structures of two or more of a nitride dielectric layer, an oxynitride dielectric layer and an oxide dielectric layer which are formed sequentially in the direction away from the substrate; and a source electrode and a drain electrode respectively located in a source region and a drain region on the nitride semiconductor layer, and a gate electrode located in a gate region between the source region and the drain region on the composite dielectric layer.

14 Claims, 5 Drawing Sheets

(51) Int. Cl.
*H01L 29/51* (2006.01)
*H01L 29/20* (2006.01)
*H01L 21/02* (2006.01)
*H01L 23/31* (2006.01)
*H01L 29/66* (2006.01)

(52) U.S. Cl.
CPC .. *H01L 21/02178* (2013.01); *H01L 21/02326* (2013.01); *H01L 23/3171* (2013.01); *H01L 29/2003* (2013.01); *H01L 29/4236* (2013.01); *H01L 29/511* (2013.01); *H01L 29/517* (2013.01); *H01L 29/518* (2013.01); *H01L 29/66462* (2013.01)

(56) References Cited

U.S. PATENT DOCUMENTS

| | | | | |
|---|---|---|---|---|
| 2008/0038852 | A1* | 2/2008 | Miyawaki | G02B 5/3008 438/21 |
| 2008/0277731 | A1* | 11/2008 | Edwards | H01L 29/1087 257/368 |
| 2010/0025730 | A1 | 2/2010 | Heikman et al. | |
| 2010/0127275 | A1* | 5/2010 | Takehiko | H01L 29/4232 257/76 |
| 2010/0193839 | A1* | 8/2010 | Takatani | H01L 29/7786 257/192 |
| 2011/0273390 | A1* | 11/2011 | Nakatsuji | G06F 3/0412 345/173 |
| 2011/0291160 | A1 | 12/2011 | Ota | |
| 2012/0217543 | A1* | 8/2012 | Minoura | H01L 21/2654 257/190 |
| 2013/0069175 | A1 | 3/2013 | Ozaki et al. | |
| 2013/0256686 | A1 | 10/2013 | Kanamura | |
| 2013/0256829 | A1* | 10/2013 | Kikkawa | H01L 29/0649 257/506 |
| 2014/0094027 | A1* | 4/2014 | Azumo | H01L 21/044 438/591 |
| 2014/0117359 | A1* | 5/2014 | Yuan | H01L 29/4908 257/59 |
| 2014/0159119 | A1* | 6/2014 | Derluyn | H01L 29/66462 257/194 |
| 2014/0353587 | A1* | 12/2014 | Hoteida | H01L 21/02381 257/22 |
| 2015/0097231 | A1* | 4/2015 | Mathur | H01L 29/7813 257/330 |
| 2015/0144955 | A1* | 5/2015 | Cheng | H01L 29/402 257/76 |

FOREIGN PATENT DOCUMENTS

| | | | |
|---|---|---|---|
| CN | 103887163 A | * | 6/2014 |
| JP | 2006250968 | | 3/2008 |
| JP | 2008072029 A | | 3/2008 |
| JP | 2008507843 A | | 3/2008 |
| JP | 2007220356 | | 3/2009 |
| JP | 2009054807 A | | 3/2009 |
| JP | 2012099617 A | | 5/2012 |
| JP | 2009302435 A | | 9/2012 |
| JP | 2011040673 | | 9/2012 |
| JP | 2012178467 A | | 9/2012 |
| KR | 10-2011-0041550 A | | 4/2011 |

OTHER PUBLICATIONS

PCT Written Opinion for PCT/CN2014/088538 (priority application), dated Dec. 31, 2014.
SIPO Office Action for CN201310482857 (priority application), dated Sep. 14, 2015.
SIPO Office Action for CN201310482857 (priority application), dated Mar. 23, 2016.
SIPO Office Action for CN201310482857 (priority application), dated Sep. 20, 2016.
Korean Office Action in counterpart Application No. 10-2016-7012142, dated Jul. 22, 2017.
Search report from counterpart Singapore application SG11201603012S, dated May 30, 2016.
Written Opinion in counterpart Singapore application 11201603012S, dated Mar. 1, 2017.
Office action in counterpart Japanese application 2016-522773, dated Feb. 15, 2017.
Office action in courterpart Japanese application 2016-522773, dated Jul. 25, 2017

* cited by examiner

III GROUP NITRIDE SEMICONDUCTOR DEVICE AND MANUFACTURING METHOD THEREOF

CROSS-REFERENCE TO RELATED APPLICATIONS

This application is a continuation of International Patent Application No. PCT/CN2014/088538 filed on Oct. 14, 2014, which claims the priority of Chinese patent application No. 201310482857.7 filed on Oct. 15, 2013, titled "III Group Nitride Semiconductor Device and Manufacturing Method thereof", the entire contents of which are incorporated herein by reference.

TECHNICAL FIELD

The present invention relates to microelectronics technology, in particular, relates to an III group nitride semiconductor device and a manufacturing method thereof.

BACKGROUND

As an III group nitride semiconductor device has a wide band gap, a high dielectric breakdown field intensity and a high electron saturation drift velocity as well as other characteristics, it is suitable for being used to produce an electronic device which has capacity of withstanding a high temperature and a high speed conversion as well as has a high power. In a nitride field effect transistor, a large amount of charges are generated in a channel layer by piezoelectric polarization and spontaneous polarization. Since two-dimensional electron gas is formed by ionization of a donor-type surface state of a nitride surface, a current density of the nitride transistor is extremely sensitive to the surface state, the presence of the surface state can easily cause a current collapse effect.

Figure 1:
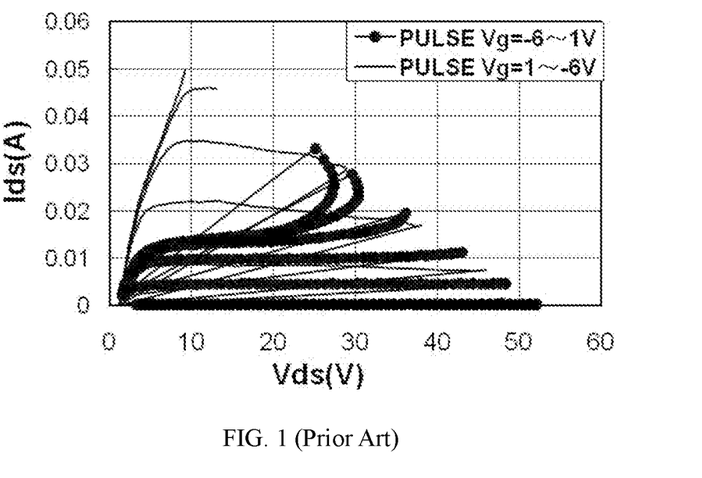
FIG. 1 is a graph illustrating an I-V curve of an insulated gate field effect transistor according to the prior art.
Figure 2:
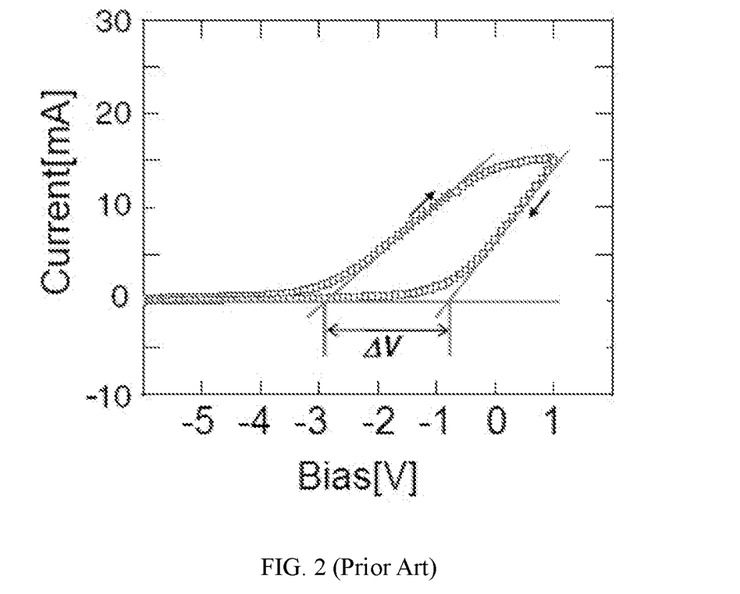
FIG. 2 is a graph illustrating a transferring curve of a charging period and a discharging period of an insulated gate field effect transistor according to the prior art.

GaN-based field effect transistors are usually classified into two types according to gate structure, that is, Schottky gate field effect transistors and insulated gate field effect transistors. For Schottky gate field effect transistors, it is easy to form a gate electrode of a Schottky contact and to control surfaces, which is ideal for a RF device. However, because Schottky gate metal and a nitride semiconductor layer are not separated by a dielectric layer, a leakage current of the gate electrode is relatively high and is increased rapidly with the increase of a reverse bias. In addition, due to restrictions for forward conduction of a Schottky contact, a bias on the gate electrode cannot exceed 2V principally, otherwise the gate electrode will lose control of the channel. Therefore, due to lack of a gate electrode having insulated dielectric, a Schottky gate field effect transistor has some issues such as a high gate leakage current and a low gate bearable voltage. For an insulated gate field effect transistor, usually a dielectric layer containing, e.g., one of silicon dioxide, aluminum oxide, hafnium oxide, silicon nitride and silicon oxynitride is disposed below the gate metal, so that the gate leakage current is relatively low, which is suitable for power devices. Therefore, due to the insulated dielectric, the insulated gate field effect transistor has a low gate leakage current and a high gate bearable voltage. But in an insulated gate field effect transistor manufactured in this way, as shown in FIG. 1, there is an interface state having a high density between the dielectric layer and the nitride semiconductor, and thus a serious current collapse effect may be caused, which is a big issue to be resolved. Furthermore, when there is a relatively high interface state between the insulating dielectric layer and the nitride semiconductor layer (such as between $Al_2O_3$ and AlGaN), under a forward bias, charging and discharging of the interface state at edges of AlGaN conduction band will lead to a lag effect of a C—V curve of the device, namely as shown in FIG. 2, a forward curve and a reverse curve do not overlap in a large extent. Therefore, it is very difficult to find a field effect transistor structure and a manufacturing method thereof which can result in a relatively low interface state for the insulated gate field effect transistor so as to minimize the current collapse effect.

Therefore, in view of the above-mentioned technical problems, it is necessary to provide an III group nitride semiconductor device and a manufacturing method thereof.

SUMMARY

In view of this, in order to resolve the above-described problems in the prior art, in an III group nitride semiconductor device, especially a nitride insulated gate field effect transistor, according to the present invention, a composite dielectric layer comprising nitride, oxynitride and oxide is used as an insulated dielectric layer between a gate metal layer and a nitride semiconductor layer, without causing an increase in interface states. Therefore, compared with a conventional nitride insulated gate field effect transistor having a single insulated layer, usage of the above-mentioned composite dielectric layer as an insulated gate dielectric layer can reduce both of a leakage current and a current collapse effect.

In a Complementary Metal Oxide Semiconductor (CMOS) device based on silicon, a very low interface state density ($1E10/cm^2$) exists between silicon and silicon dioxide which is intrinsic oxide of silicon. In the present invention, by using a similar principle, an aluminum nitride dielectric layer and its intrinsic oxide, i.e., aluminum oxynitride, are introduced on a surface of the nitride, so as to reduce density of the interface state between the dielectric layer and the semiconductor layer and thus greatly reduce the current collapse effect. A nitride layer, an oxynitride layer and an oxide layer are introduced on a surface of the nitride semiconductor layer to form a composite dielectric layer as a gate dielectric layer of the nitride insulated gate field effect transistor. For example, in a gallium nitride insulated gate field effect transistor, an aluminum nitride layer, an aluminum oxynitride layer and an aluminum oxide layer are introduced sequentially between the gallium nitride barrier layer and the gate metal layer.

On the one hand, what contacts the gate metal layer is an aluminum oxide layer which is at the top of the composite dielectric layer, this is because usage of the aluminum oxide layer as an insulating dielectric layer can bring some advantages of conventional insulated gate field effect transistors to the above-mentioned gallium nitride insulated gate field effect transistors, for example a small gate leakage current, a high gate bearable voltage and thus a relatively high input power.

On the other hand, different from the conventional nitride insulated gate field effect transistors, in the composite dielectric layer, what contacts the gallium nitride layer is the aluminum nitride dielectric layer which is at the bottom of the composite dielectric layer. The thickness of the aluminum nitride dielectric layer may be less than 2 nm, or less than 4 nm. This is because if the thickness of the aluminum nitride layer is excessive, a strong self-built electric field can lead to a significant increase in two-dimensional electron gas, causing drift of the threshold voltage.

Since a relatively low interface state exists at an interface between the nitride layer and the aluminum nitride layer, compared with the conventional structures in which a gallium nitride layer is in contact with an aluminum nitride layer, usage of the composite dielectric layer as the gate dielectric layer can greatly reduce the current collapse effect. Meanwhile, an oxynitride dielectric layer can be included between an aluminum oxide dielectric layer as an uppermost layer of the composite dielectric layer and an aluminum nitride dielectric layer as a lowermost layer of the composite dielectric layer, and can be formed by oxidation for the aluminum nitride dielectric layer. By introducing the aluminum oxynitride layer as a transition dielectric layer between the above-mentioned aluminum nitride dielectric layer and the aluminum oxide dielectric layer, the interface state of the above-mentioned two dielectric layers due to direct contact can be reduced, and impact to the current collapse effect can be reduced in a certain extent.

It should be emphasized that the core idea of the present invention is using the composite dielectric layer to reduce both of the leakage current and the current collapse effect. If only aluminum nitride is used as the insulated dielectric layer of the gallium nitride insulated gate field effect transistor, although the interface state between the gallium nitride semiconductor layer and the aluminum nitride dielectric layer can be reduced and the current collapse effect can be reduced during operation of the device, the leakage current of the device will be increased, especially when a source-drain voltage is low (e.g., less than 150V), the leakage current between the source electrode and the drain electrode under an off state will be increased significantly. The aluminum oxide dielectric layer can effectively reduce the leakage current, including the leakage current between the source electrode and the drain electrode. Thus in order to reduce both of the leakage current and the current collapse effect, the composite dielectric layer according to the present invention is required, that is, adding the aluminum oxynitride dielectric layer and the aluminum oxide dielectric layer on the aluminum nitride dielectric layer, or including any combination of two of the above-mentioned three layers.

To achieve the above-mentioned object, embodiments of the present invention provide the technical schemes as follows.

An III group nitride semiconductor device, the III group nitride semiconductor device comprising: a substrate; a nitride semiconductor layer located on the substrate; a passivation layer located on the nitride semiconductor layer, a portion of the passivation layer in a gate region being etched to expose the nitride semiconductor layer so as to form a gate groove; a composite dielectric layer located on the passivation layer and the gate groove, the composite dielectric layer comprising one or more combination structures of two or more of a nitride dielectric layer, an oxynitride dielectric layer and an oxide dielectric layer which are formed sequentially in the direction away from the substrate; and a source electrode and a drain electrode respectively located in a source region and a drain region on the nitride semiconductor layer, and a gate electrode located in a gate region between the source region and the drain region on the composite dielectric layer.

Preferably, the nitride dielectric layer comprises an aluminum nitride dielectric layer in a crystalline state or in an amorphous state.

Preferably, the aluminum nitride dielectric layer has a thickness of less than 4 nm.

Preferably, the aluminum nitride dielectric layer has a thickness of less than 2 nm.

Preferably, the oxide dielectric layer comprises one of an aluminum oxide dielectric layer, a silica dielectric layer, a hafnium oxide dielectric layer and any combination thereof.

Preferably, the oxynitride dielectric layer comprises an aluminum oxynitride dielectric layer.

Preferably, in the composite dielectric layer, a plurality of combination structures including two or more of the nitride dielectric layer, the oxynitride dielectric layer and the oxide dielectric layer which are formed sequentially in the direction away from the substrate are stacked periodically and alternately.

Preferably, the nitride semiconductor layer comprises a nitride nucleation layer, a nitride buffer layer, a nitride channel layer and a nitride barrier layer disposed sequentially in a direction away from the substrate.

Preferably, a nitride capping layer is further included between the nitride barrier layer and the passivation layer.

Preferably, the nitride capping layer comprises a gallium nitride layer.

Preferably, the nitride barrier layer is etched to form the gate groove inside the nitride barrier layer.

Preferably, a nitride insertion layer is further included between the nitride barrier layer and the nitride channel layer.

Preferably, the nitride semiconductor layer comprises one of a gallium nitride layer, an indium gallium nitride layer, an aluminum gallium nitride layer, an aluminum gallium indium nitride layer and any combination thereof.

A method of manufacturing an III group nitride semiconductor device comprises: preparing a substrate; forming a nitride semiconductor layer on the substrate; forming a passivation layer on the nitride semiconductor layer, a portion of the passivation layer in a gate region being etched to expose the nitride semiconductor layer so as to form a gate groove; forming a composite dielectric layer on the passivation layer and the gate groove, the composite dielectric layer comprising one or more combination structures of two or more of a nitride dielectric layer, an oxynitride dielectric layer and an oxide dielectric layer which are formed sequentially in the direction away from the substrate; and forming a source electrode and a drain electrode respectively in a source region and a drain region on the nitride semiconductor layer, and forming a gate electrode in a gate region between the source region and the drain region on the composite dielectric layer.

Preferably, forming the oxide dielectric layer comprises atomic layer deposition.

Preferably, forming the oxynitride dielectric layer comprises: depositing the nitride dielectric layer; and performing oxidation processing for a surface of the nitride dielectric layer so as to generate the oxynitride dielectric layer.

Preferably, the nitride dielectric layer comprises an aluminum nitride dielectric layer in a crystalline state or in an amorphous state.

Preferably, the oxide dielectric layer comprises one of an aluminum oxide dielectric layer, a silica dielectric layer, a hafnium oxide dielectric layer and any combination thereof.

Preferably, the oxynitride dielectric layer comprises an aluminum oxynitride dielectric layer.

Preferably, the nitride semiconductor layer comprises a nitride nucleation layer, a nitride buffer layer, a nitride channel layer and a nitride barrier layer disposed sequentially in a direction away from the substrate.

The advantageous effects of the present invention are as follows.

In the composite dielectric layer, the nitride dielectric layer is used as an insulating dielectric layer, similar to the conventional insulated gate field effect transistors, an III group nitride semiconductor device has advantages of a small gate leakage current, a high gate bearable voltage and accordingly a high input power.

In the composite dielectric layer, the nitride dielectric layer is used to contact the nitride barrier layer, since a low interface state exists at the interface between the gallium nitride layer and the nitride dielectric layer, compared with the conventional structures in which the nitride barrier layer contacts an oxide dielectric layer, the current collapse effect can be reduced greatly. At the same time, using the nitride dielectric layer may also passivate the surface of the gallium nitride barrier layer. By introducing the oxynitride dielectric layer as a transition dielectric layer between the nitride dielectric layer and the oxide dielectric layer, the interface state caused by direct contact between the nitride dielectric layer and the oxide dielectric layer can be reduced, and the impact to the current collapse effect by the two dielectric layers can be reduced in a certain extent.

As can be seen, in the III group nitride semiconductor device according to the present invention, the composite dielectric layer is used between the nitride barrier layer and the gate metal layer, not only the effective thickness of the insulated gate dielectric layer can be increased, but also the density of the interface state between the surface of the nitride barrier layer and the gate dielectric layer can be reduced, thus both of the leakage current and the current collapse effect can be reduced.

BRIEF DESCRIPTION OF DRAWINGS

In order to more clearly illustrate the technical schemes according to the embodiments of the present invention or the prior art, the accompanying drawings used in the embodiments of the present invention or the prior art will be introduced briefly. Apparently, the accompanying drawings described below illustrate only some of the embodiments of the present invention, other accompanying drawings can be obtained by those skilled in the art based on these accompanying drawings without creative efforts.

DETAILED DESCRIPTION

The present invention will be described in detail with reference to specific embodiments illustrated in the accompanying drawings. However, the present invention is not limited to the disclosed embodiments, rather, modifications on structures, methods or functions made by those skilled in the art based on the embodiments are included within the scope of the present invention.

Further, duplicate reference numerals or identifications may be used in different embodiments. These duplications are just for describing the present invention briefly and clearly, and do not mean that there is any association between different embodiments and/or structures.

In the following various embodiments, a nitride insulated gate field effect transistor will be described as an example of an III group nitride semiconductor device. Preferably, a GaN insulated gate field effect transistor will be described as an example.

Figure 3:
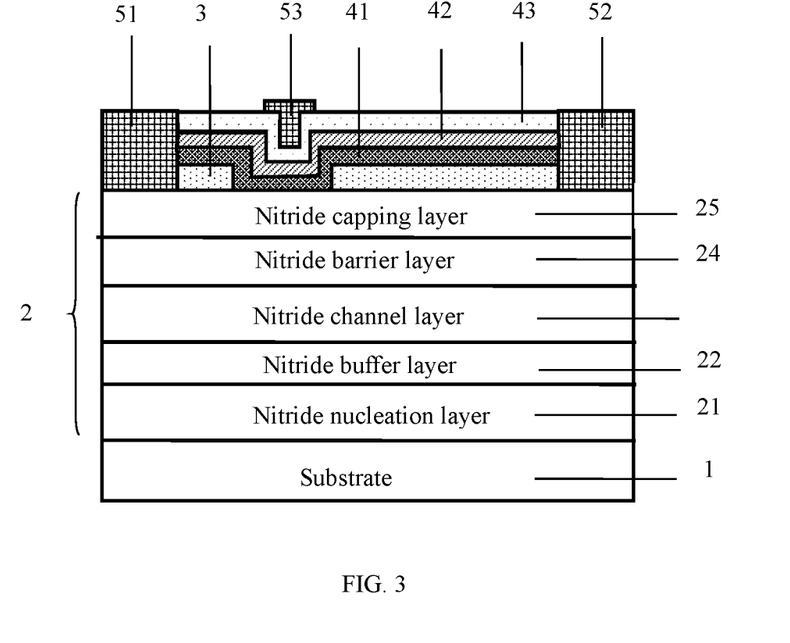
FIG. 3 is a schematic view illustrating a cross-sectional structure of a nitride insulated gate field effect transistor having a composite dielectric layer comprising a nitride dielectric layer, an oxynitride dielectric layer and an oxide dielectric layer according to a first embodiment of the present invention.

FIG. 3 is a schematic view illustrating a cross-sectional structure of a nitride insulated gate field effect transistor having a composite dielectric layer comprising a nitride dielectric layer, an oxynitride dielectric layer and an oxide dielectric layer according to a first embodiment of the present invention.

As shown in FIG. 3, an III group nitride semiconductor device according to this embodiment comprises: a substrate 1 which may comprise one of silicon, sapphire, silicon carbide and any combination thereof; a nitride semiconductor layer 2 on the substrate 1, comprising a nitride nucleation layer 21, a nitride buffer layer 22, a nitride channel layer 23, a nitride barrier layer 24 and a nitride capping layer 25 sequentially in a direction away from the substrate; a passivation layer 3 on the nitride capping layer 25, comprising one of silicon nitride, silicon aluminum nitrogen, silica and any combination thereof, wherein a portion of the passivation layer 3 in a gate region is etched to expose the nitride capping layer 25 so that a gate groove is formed; a composite dielectric layer formed on the passivation layer 3 and the gate groove, comprising a nitride dielectric layer 41, an oxynitride dielectric layer 42 and an oxide dielectric layer 43 sequentially in the direction away from the substrate; a gate electrode 53 in the gate region on the composite dielectric layer, as well as a source electrode 51 and a drain electrode 52 which contact the nitride capping layer 53 and respectively located in a source region and a drain region, wherein the gate electrode 53 is located between the source electrode 51 and the drain electrode 52. In the present embodiment, different from a conventional nitride insulated gate field effect transistor, a composite dielectric layer comprising a nitride dielectric layer 41, an oxynitride dielectric layer 42 and an oxide dielectric layer 43 sequentially from the substrate is used as an insulated gate dielectric.

In this embodiment, the nitride layer 25 is optional. In addition, the passivation layer 3 can perform the functions of passivation and protection, can further reduce the surface state of the nitride capping layer 25, and effectively reduce the current collapse effect. The oxide dielectric layer 53 contacting the gate electrode 43 can lead to a nitride field effect transistor having a low gate leakage current and a high bearable voltage. Since both of the nitride dielectric layer 41 and the nitride channel layer 23 are formed of nitride, the interface therebetween has a low interface state, which can reduce the current collapse effect compared with the conventional nitride insulated gate field effect transistors. As a transition layer between the nitride dielectric layer 41 and the oxide dielectric layer 43, the oxynitride dielectric layer 42 reduces the interface state at the interface. In the present embodiment, the nitride dielectric layer 41 comprises an aluminum nitride dielectric layer, the oxynitride dielectric layer comprises an aluminum oxynitride dielectric layer, and the oxide dielectric layer comprises one of an aluminum oxide dielectric layer, a silicon dioxide dielectric layer, a hafnium oxide dielectric layer and any combination thereof. In this embodiment, the thickness of the aluminum nitride dielectric layer is less than 4 nm, preferably less than 2 nm. This is because if the thickness of the aluminum nitride dielectric layer is excessively large, a strong self-built electric field of the aluminum nitride will result in significant increase in two-dimensional electron gas, causing drift of threshold voltage.

In this embodiment, a method of manufacturing an III group nitride semiconductor device having a composite dielectric layer comprises the steps of: preparing a substrate 1; forming a nitride semiconductor layer 2 on the substrate which comprises a nitride nucleation layer 21, a nitride buffer layer 22, a nitride channel layer 23, a nitride barrier layer 24 and a nitride capping layer 25 sequentially in a direction away from the substrate; forming a passivation layer 3 on the nitride capping layer 25 which comprises one of silicon nitride, silicon aluminum nitrogen, silica and any combination thereof etching a portion of the passivation layer 3 in a gate region to form a gate groove; forming a composite dielectric layer on the passivation layer 3 and the gate groove, the composite dielectric layer comprising a nitride dielectric layer 41, an oxynitride dielectric layer 42 and an oxide dielectric layer 43 sequentially in the direction away from the substrate; forming a gate electrode 53 in the gate region on the composite dielectric layer, and forming a source electrode 51 and a drain electrode 52 in a source region and a drain region respectively, wherein the gate electrode 53 is located between the source electrode 51 and the drain electrode 52.

Furthermore, in the above-described method of manufacturing an III group nitride semiconductor device, the composite dielectric layer can be formed by atomic layer deposition. Firstly, forming the nitride dielectric layer 41 comprises depositing aluminum nitride on the passivation layer 3 and the gate groove exposing the nitride capping layer 25 so as to form the nitride dielectric layer 41. Here, the aluminum nitride can be in a crystalline state or in an amorphous state. Then, forming the oxynitride dielectric layer 42 comprises performing oxidation processing for the surface of aluminum nitride so as to generate aluminum oxynitride. In this way, the oxynitride dielectric layer 42 is formed. Lastly, forming the oxide dielectric layer 43 comprises depositing aluminum oxide on the aluminum oxynitride dielectric layer so as to form the oxide dielectric layer 43. In this way, a gate leakage current density if further reduced.

Preferably, in the above-described method of manufacturing an III group nitride semiconductor device, forming the nitride dielectric layer 41 may comprise: delivering aluminum source and nitrogen source simultaneously, e.g., delivering ammonia while depositing aluminum atoms with aluminum trimethide, so as to forming the aluminum nitride layer by depositing aluminum atoms on the passivation layer 3 and the gate groove. Alternatively, forming the nitride dielectric layer 41 may comprise: alternately performing the steps of depositing aluminum atoms with aluminum trimethide and delivering ammonia on the passivation layer 3 and the gate groove. Furthermore, forming the nitride dielectric layer 41 may comprise: delivering ammonia on the passivation layer 3 and the gate groove, and then delivering aluminum trimethide to deposit aluminum atoms, and terminating delivering of ammonia after the completion of deposition. Here, the steps of depositing aluminum atoms and delivering ammonia can be performed repeatedly on the nitride capping layer, so as to form an aluminum nitride dielectric layer having more than one atom layer as the nitride dielectric layer 41.

Preferably, in the above-described method of manufacturing an III group nitride semiconductor device, forming the aluminum oxynitride dielectric layer 42 may comprise: performing oxidation processing to a surface of the aluminum nitride dielectric layer 41 to generate aluminum oxynitride or alumina oxide, and then depositing aluminum nitride on the aluminum oxynitride layer or the aluminum oxide layer, and then performing oxidation processing to the aluminum nitride. The above-mentioned steps are repeated, so that a structure in which aluminum nitride and aluminum oxynitride are periodically alternated or a structure in which aluminum nitride and alumina oxide are periodically alternated is formed. Since aluminum nitride crystal is dense, oxidation thereof is slow. Repeating the process of generating a thin aluminum nitride layer, a thick oxide dielectric layer or a thick oxynitride dielectric layer with a high quality can be formed.

Preferably, in the above-described method of manufacturing an III group nitride semiconductor device, forming the composite dielectric layer may comprises any combination of forming an aluminum nitride dielectric layer, forming an oxynitride dielectric layer and forming an oxide dielectric layer.

Figure 4:
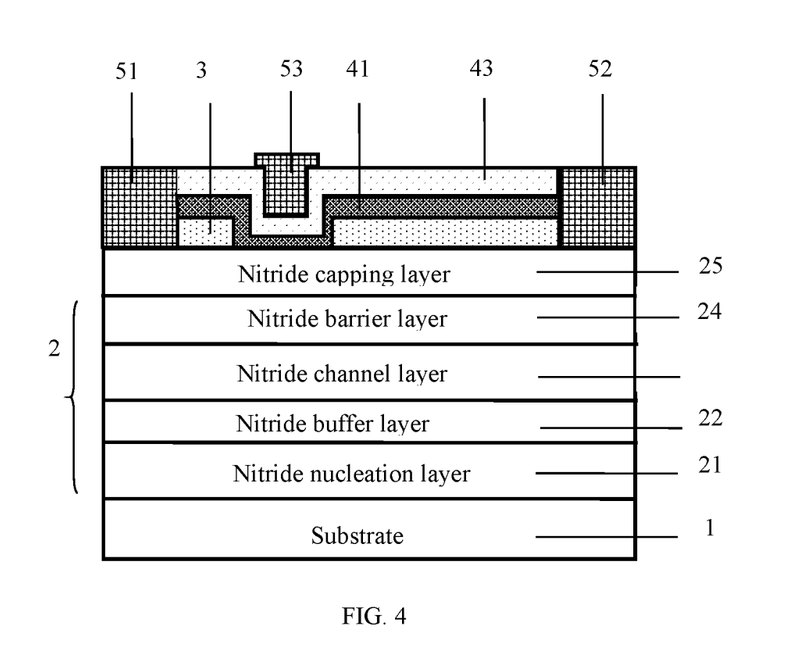
FIG. 4 is a schematic view illustrating a cross-sectional structure of a nitride insulated gate field effect transistor having a composite dielectric layer comprising a nitride dielectric layer and an oxide dielectric layer according to a second embodiment of the present invention.

FIG. 4 is a schematic view illustrating a cross-sectional structure of a nitride insulated gate field effect transistor having a composite dielectric layer comprising a nitride dielectric layer and an oxide dielectric layer according to a second embodiment of the present invention.

Compared with the first embodiment, the difference lies in that a composite dielectric layer of a nitride insulated gate field effect transistor according to this embodiment consists of an oxynitride dielectric layer 42 and an oxide dielectric layer 43, without a nitride dielectric layer. Compared with a case in which a conventional single-layer oxide dielectric layer is used as an insulated gate dielectric layer, a low surface state exists at an interface between the oxynitride dielectric layer 42 and the passivation layer 3 as well as the gate groove formed by exposing the nitride barrier layer 24, which can greatly reduce the current collapse effect. The oxynitride dielectric layer 42 and the oxide dielectric layer 43 formed on the oxynitride dielectric layer 42 have high breakdown voltages, and have high equivalent gate dielectric thicknesses due to high dielectric constants of oxynitride and oxide, which can effectively reduce a gate leakage current caused by tunnel breakdown.

Compared with the first embodiment, in a method of manufacturing a nitride insulated gate field effect transistor according to this embodiment, the composite dielectric layer comprises a nitride dielectric layer 41 and an oxide dielectric layer 43 formed on the dielectric layer 41, without an oxynitride dielectric layer. Other aspects in structure and manufacturing method are the same as the first embodiment, thus repeated description will be omitted.

Figure 5:
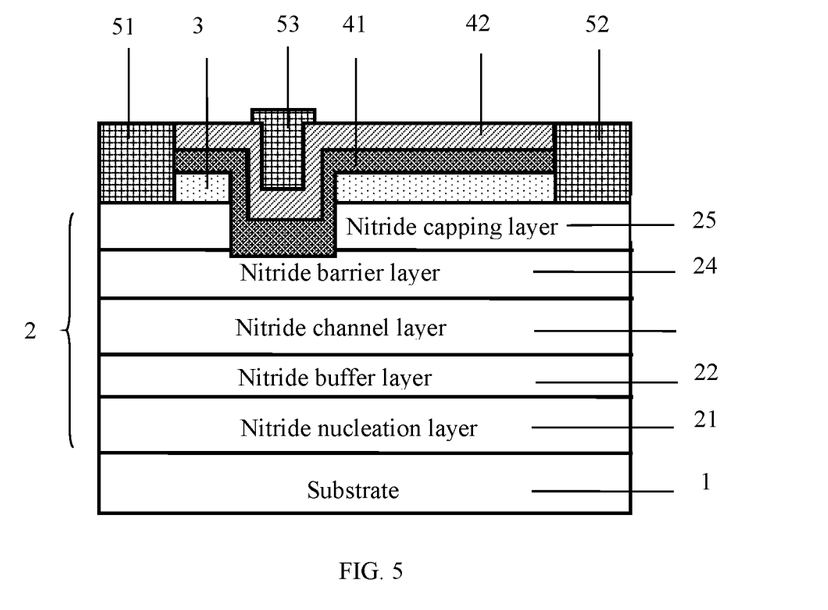
FIG. 5 is a schematic view illustrating a cross-sectional structure of a nitride insulated gate field effect transistor having a composite dielectric layer comprising a nitride dielectric layer and an oxynitride dielectric layer according to a third embodiment of the present invention.

FIG. 5 is a schematic view illustrating a cross-sectional structure of a nitride insulated gate field effect transistor having a composite dielectric layer comprising a nitride dielectric layer and an oxynitride dielectric layer according to a third embodiment of the present invention.

Compared with the first embodiment, the difference lies in that a composite dielectric layer of a nitride insulated gate field effect transistor according to this embodiment consists of a nitride dielectric layer 41 and an oxynitride dielectric layer 42, without an oxide dielectric layer. A low surface state exists at an interface between the nitride dielectric layer 41 and the passivation layer 3 as well as the gate groove formed by exposing the nitride capping layer 25 and the nitride barrier layer 24, which can greatly reduce the current collapse effect. The oxynitride dielectric layer 42 formed on the nitride dielectric layer 41 has a high breakdown voltage, and has a high equivalent gate dielectric thickness due to its high dielectric constant, which can effectively reduce a gate leakage current caused by tunnel breakdown.

Compared with the first embodiment, in a method of manufacturing a nitride insulated gate field effect transistor according to this embodiment, the composite dielectric layer comprises a nitride dielectric layer 41 and an oxynitride dielectric layer 42 formed on the dielectric layer 41, without an oxide dielectric layer. The method of forming the gate groove comprises successively etching the passivation layer 3 and the nitride capping layer 25 under the gate electrode until into the nitride barrier layer 24, and then depositing an aluminum nitride dielectric layer so as to form the nitride dielectric layer 41. Other aspects in structure and manufacturing method are the same as the first embodiment, thus repeated description will be omitted.

Figure 6:
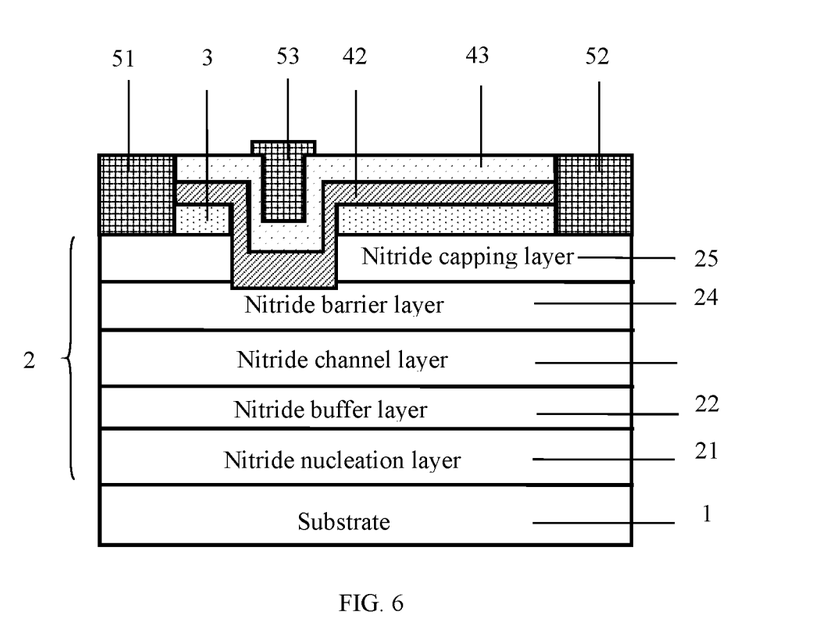
FIG. 6 is a schematic view illustrating a cross-sectional structure of a nitride insulated gate field effect transistor having a composite dielectric layer comprising an oxynitride dielectric layer and an oxide dielectric layer according to a fourth embodiment of the present invention.

FIG. 6 is a schematic view illustrating a cross-sectional structure of a nitride insulated gate field effect transistor having a composite dielectric layer comprising an oxynitride dielectric layer and an oxide dielectric layer according to a fourth embodiment of the present invention.

Compared with the first embodiment, the difference lies in that a composite dielectric layer of a nitride insulated gate field effect transistor according to this embodiment consists of an oxynitride dielectric layer 42 and an oxide dielectric layer 43, without a nitride dielectric layer. Compared with a case in which a conventional single-layer oxide dielectric layer is used as an insulted gate dielectric layer, a low surface state exists at an interface between the oxynitride dielectric layer 42 and the passivation layer 3 as well as the gate groove formed by exposing the nitride barrier layer 24, which can greatly reduce the current collapse effect. The oxynitride dielectric layer 42 and the oxide dielectric layer 43 formed on the oxynitride dielectric layer 42 have high breakdown voltages, and have high equivalent gate dielectric thicknesses due to high dielectric constants of oxynitride and oxide, which can effectively reduce a gate leakage current caused by tunnel breakdown.

Compared with the first embodiment, in a method of manufacturing a nitride insulated gate field effect transistor according to this embodiment, the composite dielectric layer comprises an oxynitride dielectric layer 42 and an oxide dielectric layer 43 formed on the oxynitride dielectric layer 42, without a nitride dielectric layer. The method of forming the oxynitride dielectric layer 42 comprises: performing oxidation processing for the nitride barrier layer firstly, and then depositing oxynitride on the nitride barrier layer. If the nitride capping layer is further disposed, firstly oxidation processing is performed for the nitride capping layer, and then oxynitride is deposited on the nitride capping layer. Alternatively, a nitride dielectric layer may be deposited firstly, and then oxidation processing is performed for the nitride dielectric layer, and the above-mentioned steps are repeated. Oxidation processing may be performed using thermal oxidation, wet oxidation or oxygen plasma oxidation. The method of forming the oxynitride dielectric layer 42 may also include atomic layer deposition, delivering ammonia, aluminum trimethide and one of ozone or oxygen plasma on the nitride barrier layer or the nitride capping layer so as to form the oxynitride. The order of delivering is adjustable. Other aspects in structure and manufacturing method are the same as the first embodiment, thus repeated description will be omitted.

Figure 7:
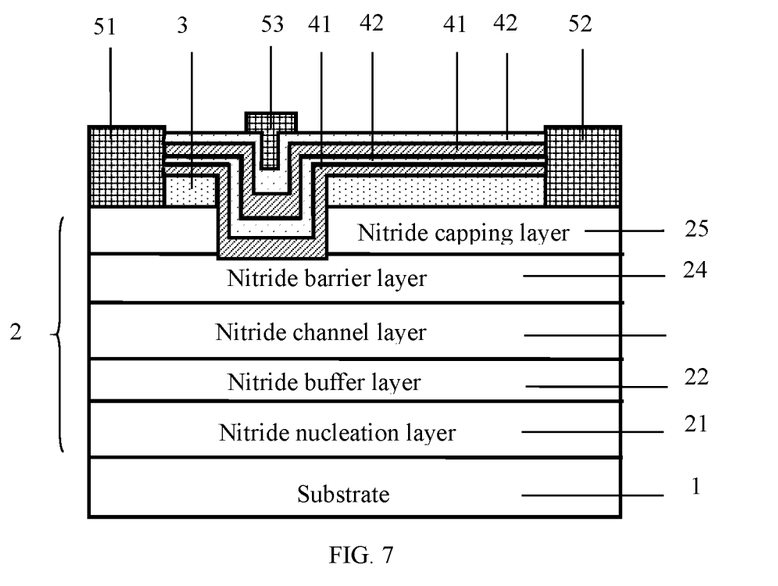
FIG. 7 is a schematic view illustrating a cross-sectional structure of a nitride insulated gate field effect transistor having a composite dielectric layer which has an alternating configuration of a nitride dielectric layer and an oxynitride dielectric layer according to a fifth embodiment of the present invention.

FIG. 7 is a schematic view illustrating a cross-sectional structure of a nitride insulated gate field effect transistor having a composite dielectric layer which has an alternating configuration of a nitride dielectric layer and an oxynitride dielectric layer according to a fifth embodiment of the present invention.

Compared with the first embodiment, the difference lies in that a composite dielectric layer of a nitride insulated gate field effect transistor according to this embodiment consists of a nitride dielectric layer 41, an oxynitride dielectric layer 42, another nitride dielectric layer 41 and another oxynitride dielectric layer 42 which are stacked alternately and periodically. The composite dielectric layer may be formed by atomic layer deposition in one step. The steps of forming the composite dielectric layer comprise: firstly depositing aluminum nitride on the nitride passivation layer 3 and the gate groove exposing the nitride barrier layer 24 so as to form the nitride dielectric layer 41 comprising aluminum nitride which may be in crystalline state or in an amorphous state; secondly, performing oxidation processing for the surface of the aluminum nitride and generating aluminum oxynitride, so as to form the oxynitride layer 42; repeating the above-mentioned steps, so as to form an alternate stacking structure of the nitride dielectric layer 41 and the oxynitride dielectric layer 42. Here, the alternate stacking structure can be repeatedly formed periodically.

Preferably, in the method of forming the nitride semiconductor device, the composite dielectric layer may be formed in multiple steps using atomic layer deposition. The method of forming the nitride dielectric layer and the method of forming the oxynitride dielectric layer are the same as those according to the first embodiment, the difference lies in that the steps are repeated so as to form an alternative stacking structure having the nitride dielectric layer 41, the oxynitride dielectric layer 42, another nitride dielectric layer 41 and another oxynitride dielectric layer 42 which are repeated periodically. In this embodiment, other aspects in structure and manufacturing method of the nitride insulated gate field effect transistor are the same as the first embodiment, thus repeated description will be omitted.

Figure 8:
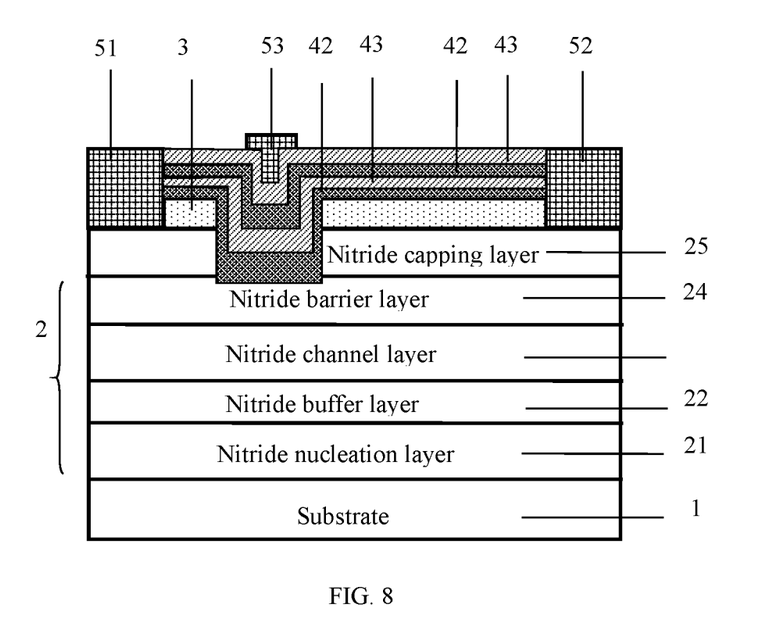
FIG. 8 is a schematic view illustrating a cross-sectional structure of a nitride insulated gate field effect transistor having a composite dielectric layer which has a periodically alternating configuration of an oxynitride dielectric layer and an oxide dielectric layer according to a sixth embodiment of the present invention.

FIG. 8 is a schematic view illustrating a cross-sectional structure of a nitride insulated gate field effect transistor having a composite dielectric layer which has a periodically alternating configuration of an oxynitride dielectric layer and an oxide dielectric layer according to a sixth embodiment of the present invention.

Compared with the first embodiment, the difference lies in that a composite dielectric layer according to this embodiment consists of an oxynitride dielectric layer 42, an oxide dielectric layer 43, another oxynitride dielectric layer 42 and another oxide dielectric layer 43 which are stacked alternately and periodically. The method of forming the oxynitride dielectric layer and the method of forming the oxide dielectric layer are the same as those according to the first embodiment, the difference lies in that the steps are repeated so as to form an alternative stacking structure having the oxynitride dielectric layer 42, the oxide dielectric layer 43, another oxynitride dielectric layer 42 and another oxide dielectric layer 43 which are repeated periodically. In this embodiment, other aspects in structure and manufacturing method of the nitride insulted gate field effect transistor are the same as the first embodiment, thus repeated description will be omitted.

Figure 9:
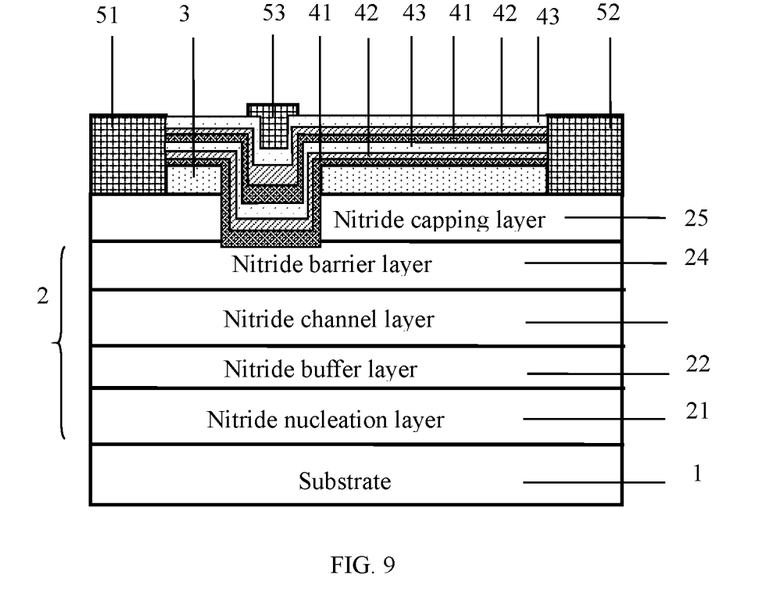
FIG. 9 is a schematic view illustrating a cross-sectional structure of a nitride insulated gate field effect transistor having a composite dielectric layer which has a periodically alternating configuration of a nitride dielectric layer, an oxynitride dielectric layer and an oxide dielectric layer according to a seventh embodiment of the present invention.

FIG. 9 is a schematic view illustrating a cross-sectional structure of a nitride insulated gate field effect transistor having a composite dielectric layer which has a periodically alternating configuration of a nitride dielectric layer, an oxynitride dielectric layer and an oxide dielectric layer according to a seventh embodiment of the present invention.

Compared with the first embodiment, the difference lies in that a composite dielectric layer according to this embodiment consists of a nitride dielectric layer 41, an oxynitride dielectric layer 42, an oxide dielectric layer 43, another nitride dielectric layer 41, another oxynitride dielectric layer 42 and another oxide dielectric layer 43 which are stacked alternately and periodically. The method of forming the nitride dielectric layer, the method of forming the oxynitride dielectric layer and the method of forming the oxide dielectric layer are the same as those according to the first embodiment, the difference lies in that the steps are repeated so as to form an alternative stacking structure having the nitride dielectric layer 41, the oxynitride dielectric layer 42, the oxide dielectric layer 43, another nitride dielectric layer 41, another oxynitride dielectric layer 42 and another oxide dielectric layer 43 which are repeated periodically. In this embodiment, other aspects in structure and manufacturing method of the nitride insulated gate field effect transistor are the same as the first embodiment, thus repeated description will be omitted.

Figure 10:
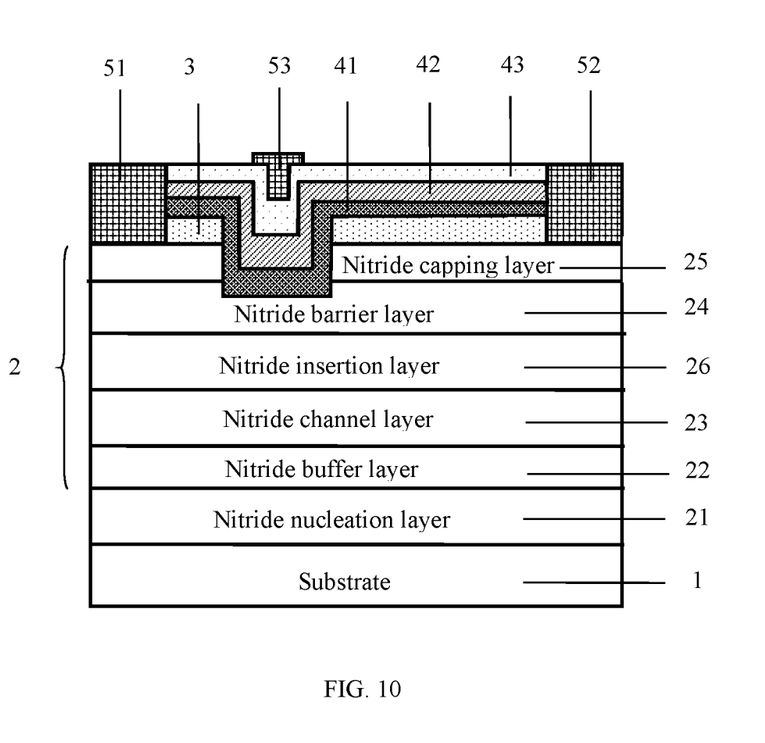
FIG. 10 is a schematic view illustrating a cross-sectional structure of a nitride insulated gate field effect transistor which has a composite dielectric layer comprising a nitride dielectric layer, an oxynitride dielectric layer and an oxide dielectric layer and has a groove structure formed at a gate electrode according to an eighth embodiment of the present invention.

FIG. 10 is a schematic view illustrating a cross-sectional structure of a nitride insulated gate field effect transistor which has a composite dielectric layer comprising a nitride dielectric layer, an oxynitride dielectric layer and an oxide dielectric layer and has a groove structure formed at a gate electrode according to an eighth embodiment of the present invention. Compared with the first embodiment, the difference of this embodiment lies in that the groove passes through the nitride capping layer 25 and is extended into the nitride barrier layer 24, and a nitride insertion layer 26 is further included between the nitride barrier layer 24 and the nitride channel 23. A low surface state exists at an interface between the nitride dielectric layer 41 and the passivation layer 3, the nitride dielectric layer 41 as well as the gate groove formed by exposing the nitride capping layer 25, which can greatly reduce the current collapse effect. The oxynitride dielectric layer 42 and the oxide dielectric layer 43 which are formed above the nitride dielectric layer 41 have high breakdown voltages, and have high equivalent gate dielectric thicknesses due to their high dielectric constants, which can effectively reduce a gate leakage current caused by tunnel breakdown.

Compared with the first embodiment, in the method of manufacturing the nitride insulated gate field effect transistor according to this embodiment, the gate groove is formed through etching the passivation layer 3, the nitride capping layer 25 and the nitride barrier layer 24 in the gate region, and then the composite dielectric layer including the nitride dielectric layer 41, the oxynitride dielectric layer 42 and the oxide dielectric layer 43 is formed on the passivation layer 3 and the gate groove. When etching is formed for the nitride capping layer 25, the over-etching can reach the nitride barrier layer 24 or the nitride insertion layer 26. Other aspects in structure and manufacturing method of the nitride insulated gate field effect transistor are the same as the first embodiment, thus repeated description will be omitted.

As can be seen from the above embodiments, the III group nitride semiconductor device manufactured by the method of manufacturing the III group nitride semiconductor device according to the present invention has the following advantageous effects.

In the composite dielectric layer, the nitride dielectric layer is used as an insulating dielectric layer, similar to the conventional insulated gate field effect transistors, an III group nitride semiconductor device has advantages of a small gate leakage current, a high gate bearable voltage and accordingly a high input power.

In the composite dielectric layer, the nitride dielectric layer is used to contact the nitride barrier layer or the nitride capping layer, since a low interface state exists at the interface between the gallium nitride layer and the nitride dielectric layer, compared with the conventional structures in which the nitride barrier layer contacts an oxide dielectric layer, the current collapse effect can be reduced greatly. At the same time, using the nitride dielectric layer may also passivate the surface of the gallium nitride barrier layer. By introducing the oxynitride dielectric layer as a transition dielectric layer between the nitride dielectric layer and the oxide dielectric layer, the interface state caused by direct contact between the nitride dielectric layer and the oxide dielectric layer can be reduced, and the impact to the current collapse effect by the two dielectric layers can be reduced in a certain extent.

Thus, in the III group nitride semiconductor device and the manufacturing method thereof according to the present invention, the composite dielectric layer is used between the nitride barrier layer and the gate metal layer, not only the effective thickness of the insulated gate dielectric layer can be increased, but also the density of the interface state between the surface of the nitride barrier layer and the gate dielectric layer can be reduced, thus both of the leakage current and the current collapse effect can be reduced.

For those skilled in the art, apparently the present invention is not limited to the details of the above-described exemplary embodiments, rather, other implementations can be used to realize the present invention without departing from the spirit or essential characteristics of the present invention. Thus, in all cases the embodiments should be construed as exemplary, rather than limiting. The scope of the present invention is defined by the appended claims rather than the foregoing description, thus all modifications within meaning and range of the appended claims and equivalents thereof are included in the present invention. Any reference numeral in the claims should not be construed as limiting the claims.

Further, it should be understood that although the present specification is described with reference to embodiments, not each embodiment contains only one independent technical scheme. The specification is so described just for clarity. Those skilled in the art should regard the specification as a whole, technical schemes of various embodiments can be combined appropriately to form other implementations which can be understood by those skilled in the art.

What is claimed is:

1. An III group nitride semiconductor device, comprising:
a substrate;
a nitride semiconductor layer located on the substrate, wherein the nitride semiconductor layer comprises a nitride nucleation layer, a nitride buffer layer, a nitride channel layer, a nitride barrier layer and a nitride capping layer disposed sequentially in a direction away from the substrate;
a passivation layer located on the nitride semiconductor layer, a portion of the passivation layer in a gate region being etched to expose the nitride semiconductor layer so as to form a gate groove, wherein the nitride capping layer is disposed between the nitride barrier layer and the passivation layer;
a composite dielectric layer located on the passivation layer and the gate groove to reduce interface state, the composite dielectric layer comprising a nitride dielectric layer, an oxynitride dielectric layer which is in direct contact with the nitride dielectric layer and an oxide dielectric layer which is in direct contact with the oxynitride dielectric layer, which are formed sequentially in the direction away from the substrate; and
a source electrode and a drain electrode respectively located in a source region and a drain region on the nitride semiconductor layer and in direct contact with the nitride capping layer, and a gate electrode located in a gate region between the source region and the drain region on the composite dielectric layer;
wherein the oxynitride dielectric layer is used as a transition dielectric layer between the nitride dielectric layer and the oxide dielectric layer, and in the composite dielectric layer, the nitride dielectric layer, the oxynitride dielectric layer and the oxide dielectric layer which are formed sequentially in the direction away from the substrate are stacked periodically and alternately, and the nitride dielectric layer comprises an aluminum nitride dielectric layer in an amorphous state.

2. The III group nitride semiconductor device according to claim 1, wherein the aluminum nitride dielectric layer has a thickness of less than 4 nm.

3. The III group nitride semiconductor device according to claim 2, wherein the aluminum nitride dielectric layer has a thickness of less than 2 nm.

4. The III group nitride semiconductor device according to claim 1, wherein the oxide dielectric layer comprises one of an aluminum oxide dielectric layer, a silica dielectric layer, a hafnium oxide dielectric layer and any combination thereof.

5. The III group nitride semiconductor device according to claim 1, wherein the oxynitride dielectric layer comprises an aluminum oxynitride dielectric layer.

6. The III group nitride semiconductor device according to claim 1, wherein the nitride capping layer comprises a gallium nitride layer.

7. The III group nitride semiconductor device according to claim 1, wherein the nitride barrier layer is etched to form the gate groove inside the nitride barrier layer.

8. The III group nitride semiconductor device according to claim 1, wherein a nitride insertion layer is further included between the nitride barrier layer and the nitride channel layer.

9. The III group nitride semiconductor device according to claim 1, wherein the nitride semiconductor layer comprises one of a gallium nitride layer, an indium gallium nitride layer, an aluminum gallium nitride layer, an aluminum gallium indium nitride layer and any combination thereof.

10. A method of manufacturing an III group nitride semiconductor device, comprising:
preparing a substrate;
forming a nitride semiconductor layer on the substrate, wherein the nitride semiconductor layer comprises a nitride nucleation layer, a nitride buffer layer, a nitride channel layer, a nitride barrier layer and a nitride capping layer disposed sequentially in a direction away from the substrate;
forming a passivation layer on the nitride semiconductor layer, a portion of the passivation layer in a gate region being etched to expose the nitride semiconductor layer so as to form a gate groove, wherein the nitride capping layer is disposed between the nitride barrier layer and the passivation layer;
forming a composite dielectric layer on the passivation layer and the gate groove to reduce interface state, the composite dielectric layer comprising a nitride dielectric layer, a high-quality and thick oxynitride dielectric layer which is in direct contact with the nitride dielectric layer and a high-quality and thick oxide dielectric layer which is in direct contact with the high-quality and thick oxynitride dielectric layer, which are formed sequentially in the direction away from the substrate; and
forming a source electrode and a drain electrode respectively in a source region and a drain region on the nitride semiconductor layer, and forming a gate electrode in a gate region between the source region and the drain region on the composite dielectric layer, wherein the source electrode and the drain electrode are both in direct contact with the nitride capping layer;
wherein the high-quality and thick oxynitride dielectric layer is used as a transition dielectric layer between the nitride dielectric layer and the high-quality and thick oxide dielectric layer, and in the composite dielectric layer, the nitride dielectric layer, the high-quality and thick oxynitride dielectric layer and the high-quality and thick oxide dielectric layer which are formed sequentially in the direction away from the substrate are stacked periodically and alternately, and the nitride dielectric layer comprises an aluminum nitride dielectric layer in an amorphous state.

11. The method of manufacturing the III group nitride semiconductor device according to claim 10, wherein forming the high-quality and thick oxide dielectric layer comprises atomic layer deposition.

12. The method of manufacturing the III group nitride semiconductor device according to claim 10, wherein forming the high-quality and thick oxynitride dielectric layer comprises:

depositing the nitride dielectric layer; and performing oxidation processing to a surface of the nitride dielectric layer so as to generate the high-quality and thick oxynitride dielectric layer.

13. The method of manufacturing the III group nitride semiconductor device according to claim 10, wherein the high-quality and thick oxide dielectric layer comprises one of an aluminum oxide dielectric layer, a silica dielectric layer, a hafnium oxide dielectric layer and any combination thereof.

14. The method of manufacturing the III group nitride semiconductor device according to claim 10, wherein the high-quality and thick oxynitride dielectric layer comprises an aluminum oxynitride dielectric layer.

* * * * *